United States Patent
Kierse et al.

(10) Patent No.: US 9,786,609 B2
(45) Date of Patent: Oct. 10, 2017

(54) STRESS SHIELD FOR INTEGRATED CIRCUIT PACKAGE

(71) Applicant: ANALOG DEVICES GLOBAL, Hamilton (BM)

(72) Inventors: Oliver J Kierse, Killaloe (IE); Frank Poucher, Raheen (IE); Michael J Cusack, Limerick City (IE); Padraig L Fitzgerald, Mallow (IE); Patrick Elebert, Nenagh (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/072,572

(22) Filed: Nov. 5, 2013

(65) Prior Publication Data

US 2015/0123256 A1    May 7, 2015

(51) Int. Cl.
H01L 23/28 (2006.01)
H01L 23/00 (2006.01)
H01L 21/56 (2006.01)
H01L 23/31 (2006.01)
(Continued)

(52) U.S. Cl.
CPC ............ *H01L 23/562* (2013.01); *H01L 21/56* (2013.01); *H01L 23/16* (2013.01); *H01L 23/295* (2013.01); *H01L 23/31* (2013.01); H01L 23/3107 (2013.01); H01L 2224/05554 (2013.01); H01L 2224/32245 (2013.01); H01L 2224/48091 (2013.01); H01L 2224/48247 (2013.01); H01L 2224/49113 (2013.01); H01L 2224/73265 (2013.01)

(58) Field of Classification Search
CPC ....... H01L 23/28; H01L 21/56; H01L 23/562; H01L 23/31
USPC ....... 257/659, 660, 704, 728, 678, 113, 777; 438/109
See application file for complete search history.

(56) References Cited

U.S. PATENT DOCUMENTS 4,660,027 A * 4/1987 Davis ................... G08B 21/185
324/433
5,508,231 A * 4/1996 Ball ...................... H01L 21/764
257/E21.573
(Continued)

FOREIGN PATENT DOCUMENTS

DE    10 2010 055 557 A1    6/2012
EP     2 284 640 A1         2/2011
WO     WO 01/48815 A1       7/2001

OTHER PUBLICATIONS

Office Action mailed Jul. 17, 2014 issued in U.S. Appl. No. 13/740,677 in 10 pages.
(Continued)

*Primary Examiner* — David Vu
*Assistant Examiner* — Mouloucoulaye Inoussa
(74) *Attorney, Agent, or Firm* — Knobbe, Martens, Olson & Bear, LLP (57) ABSTRACT

A stress shield for a plastic integrated circuit package is disclosed. A shield plate is attached by an adhesive to a top surface of an integrated circuit die such that the shield plate covers less than all of the top surface and leaves bond pads exposed. A molding material is applied over the shield plate and the integrated circuit die. The shield plate shields the integrated circuit die from stresses imparted by the molding material.

32 Claims, 7 Drawing Sheets

(51) Int. Cl.
*H01L 23/16* (2006.01)
*H01L 23/29* (2006.01)

(56) References Cited

U.S. PATENT DOCUMENTS

| | | | |
|---|---|---|---|
| 5,644,168 A * | 7/1997 | Libres | H01L 23/295 257/782 |
| 6,147,397 A | 11/2000 | Burns et al. | |
| 6,323,550 B1 * | 11/2001 | Martin | G01P 1/023 257/417 |
| 6,894,229 B1 | 5/2005 | Cheah | |
| 7,176,559 B2 | 2/2007 | Ho et al. | |
| 7,232,692 B2 | 6/2007 | Guenter et al. | |
| 7,435,624 B2 | 10/2008 | Chiu et al. | |
| 7,531,424 B1 | 5/2009 | Pai | |
| 7,763,965 B2 | 7/2010 | Webb | |
| 7,897,512 B2 | 3/2011 | Cho et al. | |
| 8,058,677 B2 | 11/2011 | Summerfelt et al. | |
| 8,933,552 B2 | 1/2015 | Krimmer | |
| 2006/0024857 A1 * | 2/2006 | Chen et al. | 438/65 |
| 2008/0197514 A1 | 8/2008 | Goida | |
| 2008/0251866 A1 * | 10/2008 | Belt | H01L 21/50 257/417 |
| 2010/0001377 A1 | 1/2010 | Kato et al. | |
| 2010/0084722 A1 | 4/2010 | Kramer et al. | |
| 2010/0327421 A1 | 12/2010 | Luan | |
| 2012/0146218 A1 | 6/2012 | Zu et al. | |
| 2012/0168945 A1 | 7/2012 | Wang et al. | |
| 2013/0292793 A1 | 11/2013 | Poucher et al. | |
| 2014/0217613 A1 * | 8/2014 | Udrea-Spenea | H01L 23/49575 257/777 |
| 2014/0353772 A1 * | 12/2014 | Stermer, Jr. | B81C 1/00325 257/415 |
| 2015/0035130 A1 * | 2/2015 | How | H01L 21/56 257/678 |

OTHER PUBLICATIONS

Office Action mailed Nov. 14, 2014 issued in U.S. Appl. No. 13/740,677 in 10 pages.
Office Action mailed Apr. 16, 2015 issued in U.S. Appl. No. 13/740,677 in 13 pages.
Office Action mailed Oct. 15, 2015 issued in U.S. Appl. No. 13/740,677 in 11 pages.
Gillot et al., "Wafer level thin film encapsulation for MEMS," Conference on High Density Microsystem Design and Packaging and Component Failure Analysis, 2005, 4 pages.
Office Action mailed Dec. 7, 2016 issued in Chinese Application No. 201410560196.X, in 10 pages.
Office Action dated Jun. 13, 2017 in German Application No. 102014115144.5, in 14 pages.
Office Action dated Jul. 13, 2017 in Chinese Application No. 201410560196.X, 8 pages.

* cited by examiner

STRESS SHIELD FOR INTEGRATED CIRCUIT PACKAGE

BACKGROUND OF THE INVENTION

Field of the Invention

The field relates generally to integrated circuit packages, and, more particularly, to integrated circuit packages having a mechanical stress shield.

Description of the Related Art

Integrated circuits are typically coupled to a larger electronic system by assembling an integrated circuit die to a package substrate and encapsulating the integrated circuit die with a molding material. Some electronic circuits in the integrated circuit die may be sensitive to stress, temperature, moisture, and/or other factors that can negatively affect the performance of the electronic circuit. Packaging has been developed to protect integrated circuit dies and to facilitate connection into larger systems. However, in some situations, the packaging can negatively affect the performance of sensitive electronic circuits. For example, in various arrangements, the molding material applied over the integrated circuit die may modify or damage underlying sensitive circuitry under certain conditions, which can deteriorate the performance of the larger electronic system or device. Accordingly, there remains a continuing need for improved packaging arrangements that protect sensitive electronic circuitry in the integrated circuit die from other components in the package.

SUMMARY

In one embodiment, an integrated circuit package is disclosed. The integrated circuit package can include a package substrate. An integrated circuit die can be mounted to the package substrate. The integrated circuit die can comprise a bottom surface coupled to the package substrate and a top surface opposite the bottom surface. A molding material can be applied over the integrated circuit die. A shield plate can be attached by an adhesive to the top surface of the integrated circuit die between the molding material and the integrated circuit die.

In another embodiment, a method of packaging an integrated circuit is disclosed. The method can comprise adhering a shield plate to a top surface of an integrated circuit die. The method can also include applying a molding material over the shield plate and the integrated circuit die.

In some arrangements, the shield plate can cover less than all of the top surface and can leave bond pads exposed.

In another embodiment, an integrated circuit package is disclosed. The integrated circuit package can include a package substrate and an integrated circuit die mounted to the package substrate. The integrated circuit die can have a top surface and a bottom surface. The integrated circuit die can comprise a stress-sensitive circuit near the top surface and one or more trenches at least partially surrounding the stress-sensitive circuit. A molding material can be applied over the integrated circuit die. The integrated circuit package can include means for shielding the stress-sensitive circuit from stresses induced by the molding material. The stresses can include a component perpendicular to the top surface of the integrated circuit die.

In some arrangements, the one or more trenches can be formed through the bottom surface of the integrated circuit die. In addition, in some embodiments, the top surface of the integrated circuit die can face the package substrate, and the shielding means can comprise the package substrate. In some embodiments, the shielding means can comprise a shield plate adhered to the integrated circuit die over the stress-sensitive circuit.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION

Various embodiments disclosed herein relate to an integrated circuit (IC) package having a shield plate adapted to shield sensitive portions of an integrated circuit die from stresses imparted on the IC die by other components of the package. In various embodiments, the IC die is mounted to a package substrate, such as a leadframe, printed circuit board (PCB), etc. The IC die can be wire bonded or otherwise electrically coupled to the package substrate. To protect the IC die during use, the IC die can be encapsulated with a molding material. The molding material can include a large number of filler particles, such as silica particles. As explained herein, the molding material can impart stresses on the IC die that vary spatially in a substantially random manner. The varying stresses can modify the electrical performance of some sensitive electronic circuits. For example, some sensitive precision components in the IC die, such as a bandgap reference circuit, may output an absolute voltage. The stresses imparted on such sensitive precision components can cause unacceptable shifts in the output voltage that deteriorate the overall performance of the IC die.

In various embodiments disclosed herein, a shield plate is adhered to the IC die over sensitive portions of the IC die, e.g., over various sensitive electronic circuits. The shield plate can be coupled to the IC die using an adhesive, and the molding material can be applied over the shield plate and the IC die such that the shield plate is disposed between the IC die and the molding material. In some embodiments, the shield plate can be sized and shaped to cover the sensitive portions of the IC die, e.g., such that the shield plate covers the sensitive electronic circuit or sensitive components of the circuit. Thus, for embodiments in which the IC die is wire bonded to the underlying substrate, the shield plate can be mounted to the IC die such that the shield plate covers less than all the top surface of the IC die and leaves bond pads exposed. In other embodiments, the IC die can be mounted to a substrate, and through-silicon vias (TSVs) may be used to electrically connect bond pads to the underlying substrate. In such embodiments, the shield plate may cover a larger area of the top surface of the IC die, for example, substantially the entire top surface of the IC die.

In some embodiments, the shield plate can comprise a silicon cap or plate that absorbs stresses that would otherwise be transmitted to the sensitive portions of the IC die. Thus, the disclosed shield plate can shield or block stresses, and the resulting strain, from propagating to the sensitive portions of the IC die, maintaining the performance of the sensitive circuitry. In addition to shielding sensitive portions of the IC die to stresses imparted by the molding material, the shield plate can also shield the sensitive portions or circuits from stresses imparted during assembly of the package into the larger electronic system, during testing of the package, and/or during operation by the end user. The shield plates disclosed herein may comprise a monolithic plate (e.g., a unitary body); in other embodiments, however, the shield plates may comprise a laminate or layered plate. Furthermore, although the embodiments illustrated herein shown one shield plate per IC die, it should be appreciated that any suitable number of shield plates can be used per IC die.

Furthermore, the embodiments disclosed herein can be implemented at reduced costs, for example, by adhering a plate or cap to the IC die over only sensitive portions of the IC die, but not over the entire top surface of the die. By adhering the shield plate to only portions of the IC die, the package assembler can save money and materials relative to implementations in which a material or layer is applied or deposited over the entire top surface of the IC die. Furthermore, because the shield plate is relatively hard and/or stiff, the shield plate can internally absorb and/or distribute the imparted stresses and prevent localized stresses from propagating to the sensitive portions of the IC die. If a component of the imparted stresses does propagate to the IC die, then the propagated stress may be applied uniformly across at least the sensitive circuits of the die and/or may be diminished relative to implementations without a shield plate, which may be acceptable for electrical performance in some arrangements.

In addition, the shield plates disclosed herein can advantageously shield the IC die from stresses that are imparted over time. Over the lifetime of the package, the moisture content may vary substantially. For example, the moisture content in the molding material may change as the package is assembled and integrated into the larger electronic system, and as the package is used by an end user of the larger electronic system. The shield plate can shield the IC die from stresses that are induced over the lifetime of the package, including stresses imparted by changing moisture content in the molding material over the lifetime of the package. Furthermore, the amount of moisture to which the package is exposed can differ according to application and environment of use such that it is difficult to calibrate the circuits to compensate for the stresses.

In contrast to the shield plates disclosed herein, stresses may not be adequately absorbed or blocked in implementations that utilize only a softer material (such as a soft polymer like photoresist or polyimide) and/or that apply or deposit a layer of material across the IC die. For example, in arrangements that apply a material having a relatively low modulus of elasticity over the IC die, a relatively high thickness of the material may be needed to provide adequate shielding. Accordingly, placing and adhering a plate to the IC die can be easier to manufacture than depositing layers, because it may be difficult to deposit layers having a sufficiently high thickness and/or modulus to adequately absorb the stresses. In addition, silicon shield plates may act to strengthen or stiffen the overall package relative to less stiff materials.

In other implementations, it may be desirable to adhere a shield plate over a larger portion of the top surface of the IC die. For example, in some embodiments, the shield plate can cover most of the top surface of the IC die but leave bond pads exposed. Such a large shield plate may advantageously shield the IC die from stresses over a large portion of the die. In addition, adhering a large shield plate to the die may be easier from a manufacturing standpoint, because placing the relatively large shield plate over the IC die may be less sensitive to positioning errors than aligning a relatively small shield plate over specific portions of the IC die.

Figure 1:
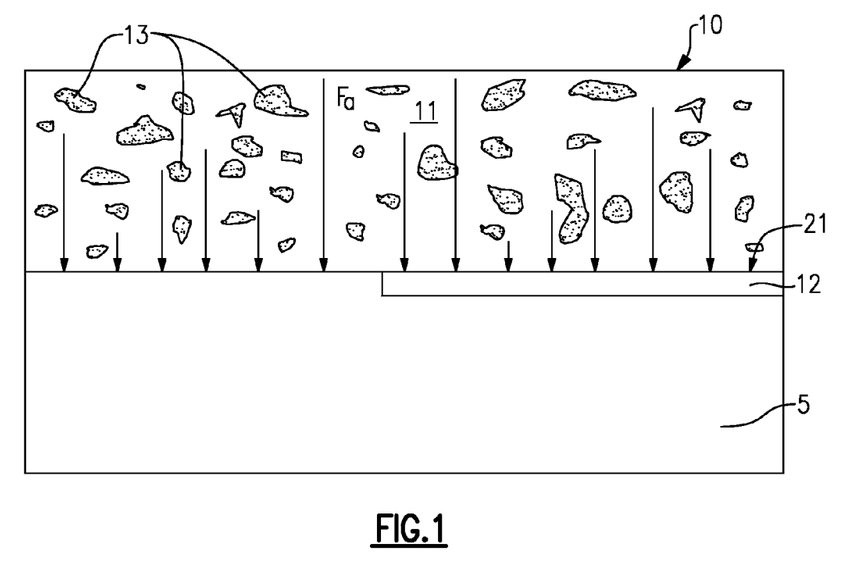
FIG. 1 is a schematic side cross-sectional view of a portion of an integrated circuit package in which a molding material induces varying forces against an integrated circuit die.

FIG. 1 is a schematic side cross-sectional view of a portion of a plastic integrated circuit package in which a molding material 10 induces varying forces against an integrated circuit (IC) die 5. The IC die 5 can include various types of circuitry. As skilled artisans would appreciate, in some arrangements, the circuitry can be formed in multiple layers of metal and dielectric materials with a passivation layer exposed on a top surface 21 of the IC die 5. Furthermore, one or more sensitive electronic circuits 12 can be defined in the IC die 5. It should be appreciated that sensitive electronic circuit 12 is illustrated schematically in FIG. 1. However, a skilled artisan would understand that the sensitive electronic circuit 12 can be formed from one or more layers of the IC die 5. The sensitive electronic circuit 12 can include any suitable portion of the IC die 5 that is sensitive to external forces or stresses. For example, as explained herein, the sensitive circuit 12 can be a precision component that outputs an absolute reference voltage, as opposed to outputting or measuring relative voltages. In some embodiments, for example, the sensitive circuit 12 can be a bandgap reference circuit.

As shown in FIG. 1, the molding material 10 can be applied or deposited over the IC die 5 and the sensitive circuit 12. The molding material 10 of FIG. 1 can include a plastic material 11 and multiple filler particles 13 dispersed throughout the plastic material 11. In some embodiments, for example, the plastic material 11 can comprise an epoxy molding compound, for example, a resin. The filler particles 13 can comprise silica, or silicon dioxide, in some implementations. In some arrangements, such filler particles 13 are dispersed throughout the plastic material 11 to reduce coefficient of thermal expansion mismatch between the molding material 10 and the IC die 5, which can be formed primarily of silicon or other suitable semiconductor materials. For example, in some molding materials 10, the filler particles 13 can account for about 80% to about 90% of the molding material 10, and the plastic material 11 can account for about 10% to about 20% of the molding material 10. The filler particles 13 may have varying sizes, as shown schematically in FIG. 1. For example, the sizes of silica particles can range from about 1 micron to about 50 microns, and in some cases, from about 1 micron to about 100 microns. By dispersing large amounts of silica in the molding material 10, thermally induced stresses near the die-molding material interface that may arise when the package is thermally cycled (e.g., heated and cooled) can be reduced.

However, the presence of the filler particles 13 in the molding material 10 can induce a spatially varying applied force $F_a$ on the top surface 21 of the die 5. For example, the filler particles 13 can have sizes that vary substantially randomly, and the filler particles 13 can be substantially randomly distributed throughout the molding material 10. At various times during the life of the package, the moisture content, temperature, and/or other environmental conditions of the molding material 10 may change. During manufacturing or assembly, or during use by the end user, varying amounts of moisture can be absorbed by the molding material 10. For example, during assembly, the humidity of the factory may be controlled, but during use by the end user, the humidity may increase if the package is integrated in an electronic system exposed to the atmosphere. As the material 10 absorbs the moisture, the filler particles 13 within the molding material 10, particularly hygroscopic silica particles, can swell or be displaced such that the position of the filler particles 13 may change relative to the top surface 21 of the die 5. Because the positions and sizes of the filler particles 13 may vary randomly, the pressures exerted by the filler particles 13 due to moisture (or other environmental factors) may also vary significantly across the die 5.

The expanded or displaced particles 13 can induce the spatially varying force $F_a$ on the top surface 21 of the die 5. The induced force $F_a$ may have force components normal to the top surface 21 of the die 5 (as schematically illustrated in FIG. 1) and/or tangential or parallel to the top surface 21 of the die 5. The force $F_a$ can thus transmit an uneven stress to the top surface 21 of the die 5 and the sensitive electronic circuit 12. As a result, the transmitted stress may induce strain in the sensitive circuit 12 that modifies the electronic or electrical properties of the circuit 12. Indeed, because the transmitted stress may vary across the dimensions of the sensitive circuit 12, the strain (e.g., the deformation) of the sensitive circuit 12 may vary within the circuit 12 itself. In some circuits, such modifications to the electronic properties may not appreciably affect the overall performance of the die 5. For example, circuits that output relative voltages may be less affected by the induced stresses than in circuits that output absolute voltages. However, as explained herein, circuits that output absolute voltage values, such as a bandgap reference circuit, may experience a drift in output voltage that deteriorates the overall performance of the package and/or of the larger electronic device or system. Accordingly, it can be advantageous to shield sensitive portions of the IC die 5 from stresses imparted on the IC die 5 by the molding material 10 and/or other components of the package.

Figure 2:
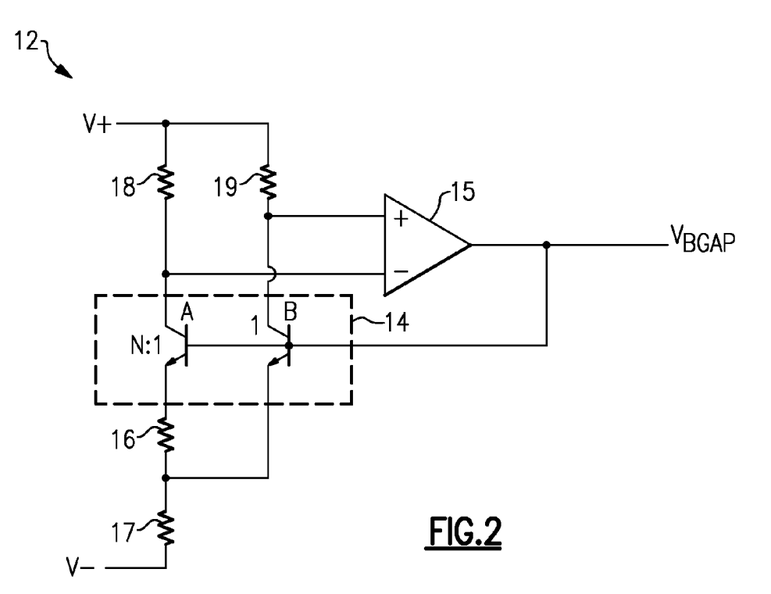
FIG. 2 is a schematic circuit diagram of an example sensitive electronic circuit used in various integrated circuit dies, according to some embodiments.

FIG. 2 is a schematic circuit diagram of an example sensitive electronic circuit 12 used in various integrated circuit dies, according to some embodiments. In FIG. 2, the sensitive electronic circuit 12 is a bandgap reference circuit. The bandgap reference circuit can be a Brokaw bandgap reference circuit as illustrated in FIG. 2. The bandgap reference circuit includes an amplifier 15 configured to generate a substantially constant output voltage $V_{BGAP}$, even as a difference between positive voltage V+ and negative voltage V− changes. For instance, the negative voltage V− can be a ground potential and the positive voltage V+ can be a power supply voltage. In this example, the output voltage $V_{BGAP}$ can be substantially constant as the power supply voltage varies. A pair of ratioed transistors includes a first transistor A and a second transistor B that can generate inputs to the negative and positive input terminals, respectively, of the amplifier 15. As illustrated, the first and second transistors A and B are bipolar transistors each having a collector, a base, and an emitter. The collector of the first transistor A can provide an input to the negative input terminal of the amplifier 15 and the collector of the second transistor B can provide an input to the positive input terminal of the amplifier 15. The emitter of the first transistor A is electrically connected to a negative voltage V− via two resistors 16 and 17 in series. The emitter of the second transistor B is electrically connected to a node between the series resistors 16 and 17. A positive voltage V− is electrically connected to the collector of the first transistor A via a resistor 18 and the positive voltage V+ is electrically connected to the collector of the second transistor B via a separate resistor 19.

The stability of the output voltage $V_{BGAP}$ can depend on the electrical characteristics associated with a precise ratio of the emitter area of the first transistor A to the emitter area of the second transistor B. As illustrated, the ratio of emitter areas of the first transistor A to the second transistor B can be N:1, in which N is at least approximately 2. For instance, N can be a positive integer that is two or greater. As used herein, an integer ratio encompasses ratios that vary from exact mathematical integer ratios due to process variations, such as standard variations from non-uniformities in photolithography, etching, doping, etc. According to some implementations, N is 8. In other non-limiting examples, N can be at least 4 or at least 8. Electrical characteristics of the first transistor A relative to electrical characteristics of the second transistor B may be affected, for example, by mechanical stresses resulting from uneven mechanical stresses on different portions of the emitters in the ratioed pair of transistors 14, such as described with reference to FIG. 1.

The first transistor A can be a first composite transistor formed from a first group of transistors. Similarly, the second transistor B can be a second composite transistor formed from a second group of transistors. Each transistor from the first group of transistors and each transistor from the second group of transistors can have substantially the same emitter area. Accordingly, there can be N times as many transistors in the first group of transistors as in the second group of transistors. The transistors in the first group can be arranged in parallel with each other so that the first composite transistor can have a first emitter area that corresponds to the sum of emitter areas of the transistors in the first group. Similarly, the second group of transistors can be arranged in parallel with each other so that the second composite transistor can have a second emitter area that corresponds to the sum of emitter areas of the transistors in the second group. When some other ratioed circuit elements, such as resistors, are composite circuit elements formed from groups of circuit elements, the circuit elements of the group can be arranged in series with each other.

Stresses imparted on the sensitive electronic circuit 12 shown in FIG. 2 may cause an unacceptable voltage shift that reduces the performance of the IC die and/or the larger electronic system. For example, in some arrangements, stresses induced on the circuit 12 shown in FIG. 2 may disadvantageously shift the output voltage by about 4 mV to about 5 mV for a bandgap reference circuit having $V_{BGAP}$ in a range of about 1V to about 5V, such as about 1.25 V in some arrangements. Such large shifts in output voltage may be unacceptable to the overall performance of the package and/or the larger electronic system. Although the sensitive circuit 12 shown in FIG. 2 is a bandgap reference circuit, the embodiments disclosed herein can advantageously shield other sensitive circuits on a die from stresses. Other precision components that output or sense absolute voltages may be protected by the disclosed shield plates. In still other embodiments, other sensitive portions of the die 5 may be shielded from stresses imparted on the die 5 by the molding material 10, or by other portions of the package.

Figure 3A:
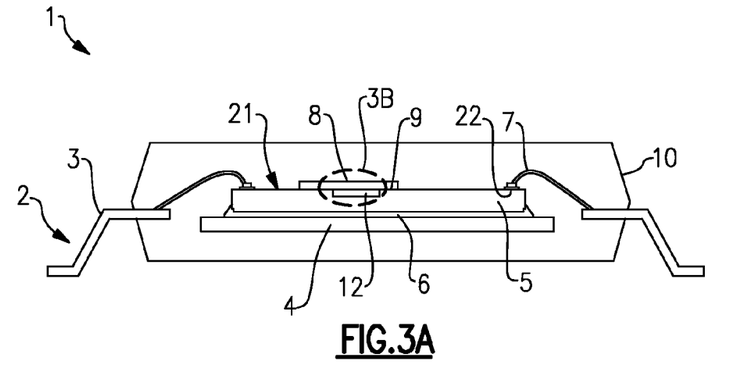
FIG. 3A is a schematic side cross-sectional view of an integrated circuit package, according to one embodiment.
Figure 3B:
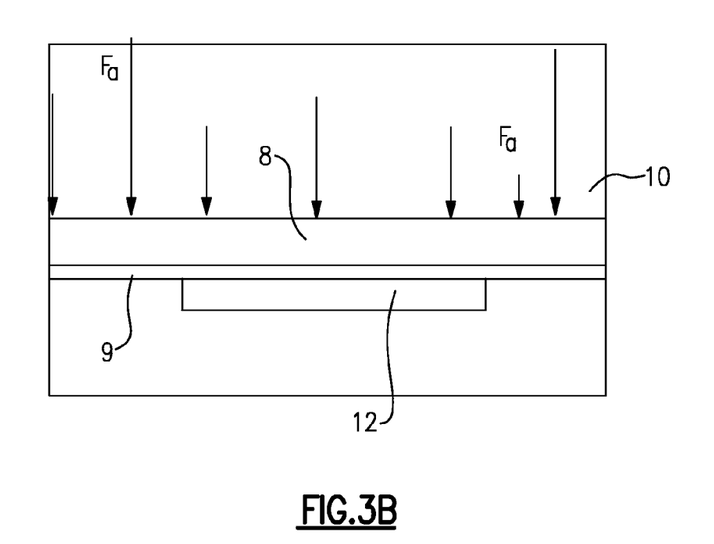
FIG. 3B is a magnified side cross-sectional view of the integrated circuit package of FIG. 3A.

FIG. 3A is a schematic side cross-sectional view of a plastic integrated circuit package 1, according to one embodiment. FIG. 3B is a magnified side cross-sectional view of the integrated circuit package 1 of FIG. 3A. The package 1 can include a package substrate 2 and an integrated circuit (IC) die 5 mounted on the package substrate 2. The package substrate 2 shown in FIG. 3A is a leadframe substrate, but it should be appreciated that any suitable package substrate may be used in the disclosed embodiments. For example, in other embodiments, a printed circuit board (PCB) or a ceramic substrate or carrier may be used as the package substrate 2.

The IC die 5 can be mounted to a die paddle 4 using a die attach material 6. The die attach material 6 can be any suitable adhesive capable of securing the IC die 5 to the die paddle 4. For example, in various embodiments, an epoxy can be used to adhere the die 5 to the die paddle 4. In other embodiments, the die 5 can be plated and soldered to the die paddle 4. Still other die attach materials 6 may be suitable. The IC die 5 can be any suitable integrated circuit die that includes various electronic circuits. For example, the IC die 5 can be patterned with one or more sensitive electronic circuits 12 in sensitive portions of the die 5. As explained above, in some embodiments, the sensitive circuits 12 can output an absolute reference voltage. In one embodiment, the sensitive circuit 12 is a bandgap reference circuit.

In the embodiment of FIG. 3A, the IC die 5 is electrically coupled to leads 3 of the package substrate 2 by way of bonding wires 7. The bonding wires 7 can electrically connect bond pads 22 of the IC die 5 to the corresponding leads 3. The bonding wires 7 can be made of any suitable conductive material, such as gold or copper. Although the die 5 is wire bonded in FIG. 3A to leads 3 of the leadframe, it should be appreciated that the die 5 can electrically communicate with the substrate 2 in other ways. For example, in some embodiments (such as those that utilize a PCB for the package substrate 2), the die 5 can be soldered to the substrate 2, and internal traces within the package substrate 2 can provide electrical communication between the IC die 5 and an external system motherboard. The die 5 can also be flip chip mounted and coupled to the substrate 2 in some embodiments. In still other arrangements, the IC die 5 can be electrically coupled to the package substrate using non-conductive paste (NCP) or anisotropic conductive film (ACF) technologies.

A molding material 10 (or encapsulant) can be applied over the IC die 5 to protect the IC die 5 from the outside environs. In some embodiments, the molding material can include a plastic material (such as an epoxy molding compound) that includes silica or other types of filler particles to enhance thermal matching between the molding material 10 and the IC die 5. However, as explained above with respect to FIG. 1, the molding material 10 may apply spatially varying forces $F_a$ or stresses to a top surface 21 of the die 5 and to sensitive electronic circuits 12. For example, in molding materials 10 that include large amounts of silica particles, moisture can swell the plastic material 11 that surrounds the particles 13 to varying degrees, resulting in spatially varying stresses across the top surface 21. For some sensitive circuits 12, the spatially varying stresses can degrade overall performance of the package and/or the larger electronic system.

Accordingly, in the embodiment shown in FIGS. 3A and 3B, means are provided for protecting the sensitive circuits 12 from vertical stresses. In the illustrated embodiment, a shield plate 8 can be adhered to the top surface 21 of the IC die 5 using an adhesive 9. As shown in FIGS. 3A and 3B, the shield plate 8 can cover the sensitive circuit 12 to shield the circuit 12 from stresses imparted by the molding material 10. The shield plate 8 can be dimensioned and can be formed of a material such that stresses that would otherwise be imparted to the sensitive portions of the die 5 are absorbed by the shield plate 8. The adhesive 9 can be any suitable adhesive, such as an epoxy. For example, in one embodiment, the epoxy can be QMI536 manufactured by Dexter Electronic Materials Div., The Dexter Corp., City of Industry, Calif. In some embodiments, the adhesive 9 can have a thickness in a range of about 20 microns to about 40 microns. Thus, in some embodiments, the shield plate 8 can be attached directly to the IC die 5 with only the adhesive 9 intervening between the plate 8 and the IC die 5.

The shield plate 8 can be formed of a material suitable for blocking stresses generated by the molding material 10 from being transmitted to the sensitive circuit 12. For example, in some embodiments, the shield plate 8 can comprise a silicon cap or plate. The use of silicon as the shield plate 8 can also reduce thermal stresses at the interface between the shield plate 8 and the IC die 5, because silicon provides a good thermal match with the IC die 5, which is typically formed mostly of silicon (or another suitable semiconductor material). Thus, when the package 1 is heated or otherwise subject to thermally induced stresses, a silicon shield plate would not induce significant stresses at the interface between the shield plate 8 and the die 5. In other embodiments, the shield plate 8 can comprise a glass cap or plate. In yet other embodiments, the shield plate 8 can comprise a metal plate adhered to the die 5 with an adhesive. In some embodiments, the top surface of the shield plate 8 (the side of the plate 8 that faces away from the die 5 and towards the molding material 10) may be roughened (see FIG. 4, for example). Roughening the top surface of the shield plate 8 may enhance adhesion of the molding material 10 to the shield plate 8 and may prevent or reduce the risk of the molding material 10 delaminating from the shield plate 8.

In the illustrated embodiment, the shield plate 8 is a substantially planar plate. The die 5 shown in FIGS. 3A-3B does not include an internal cavity, e.g., there is no die cavity covered by the plate 8. For example, in the embodiment of FIGS. 3A-3B, one side of the adhesive 9 is continuously attached to the bottom surface of the shield plate 8, and the entire other side of the adhesive 9 directly contacts the die 5, e.g., a top passivation layer of the die 5. The shield plate 8 can be relatively hard or stiff in some embodiments to absorb stresses that are imparted on the shield plate 8 by the molding material 10. By absorbing the induced stresses, the shield plate 8 can act as a buffer to prevent or reduce the transmission of stresses from the molding material 10 to the sensitive circuit 12 (and/or other sensitive portions) of the IC die 5. For example, the shield plate 8 may spread the induced stresses out over the area of the shield plate 8. In some embodiments, the shield plate 8 can have a stiffness or Young's modulus higher than a stiffness or Young's modulus of the molding material 10. Furthermore, a relatively stiff shield plate 8 may protect sensitive portions of the IC die 5 better than softer or more elastic materials, such as polymers like photoresist or polyimide. In addition, it can be easier to adhere a plate to the IC die than to deposit a thick polymer layer over the die, because it can be difficult to deposit polymer layers to a sufficiently high thickness to isolate the sensitive circuit 12 from stresses or uniformly distribute stresses over the sensitive circuit 12.

Furthermore, the shield plate 8 can be sized and shaped to cover the sensitive circuit 12 and/or sensitive portions of the circuit 12 to adequately shield the circuit 12 from stresses. For example, in some embodiments (such as those that use silicon or glass shield plates), the shield plate 8 can have a thickness in a range of about 100 microns to about 300 microns, or more particularly, in a range of about 150 microns to about 250 microns. In one embodiment, the shield plate 8 can have a thickness of about 200 microns. Thus, the shield plate 8 can reduce or eliminate voltage shifts or other electrical modifications caused by uneven stresses imparted by the molding material 10 or other components of the package 1, which can improve the overall performance of the package 1 or the larger electronic system. Furthermore, the shield plate 8 disclosed herein can protect the sensitive portions 12 of the IC die 5 over the life of the package 1, including changing moisture conditions or other changing environmental factors. As the moisture content, temperature, or other conditions change, the shield plate 8 can maintain a stress buffer between the molding material 10 and the sensitive circuit 12. Thus, downstream customers and/or end users need not re-calibrate the package 1 for different operating conditions.

Although the shield plate 8 is illustrated in FIG. 3A as covering the entire sensitive electronic circuit 12, it should be appreciated that the shield plate 8 may instead cover only a portion of the sensitive electronic circuit 12. For example, in some embodiments, the shield plate may cover only a portion of the bandgap reference circuit shown schematically in FIG. 2. Thus, in the embodiments disclosed herein, the shield plate 8 can be attached to the IC die 5 over the entire sensitive electronic circuit 12, or only over some particularly sensitive components (particularly the ratioed transistors) of the circuit 12. In still other embodiments, the shield plate 8 can cover an area slightly or substantially larger than the sensitive electronic circuit 12, for example, to ensure that the boundaries of the circuit 12 and/or neighboring components are shielded from stresses. In some embodiments, the shield plate 8 can cover a portion of the top surface 21 of the IC die 5 that has substantially the same area as the area of the sensitive circuit 12 to be shielded.

Figure 3C:
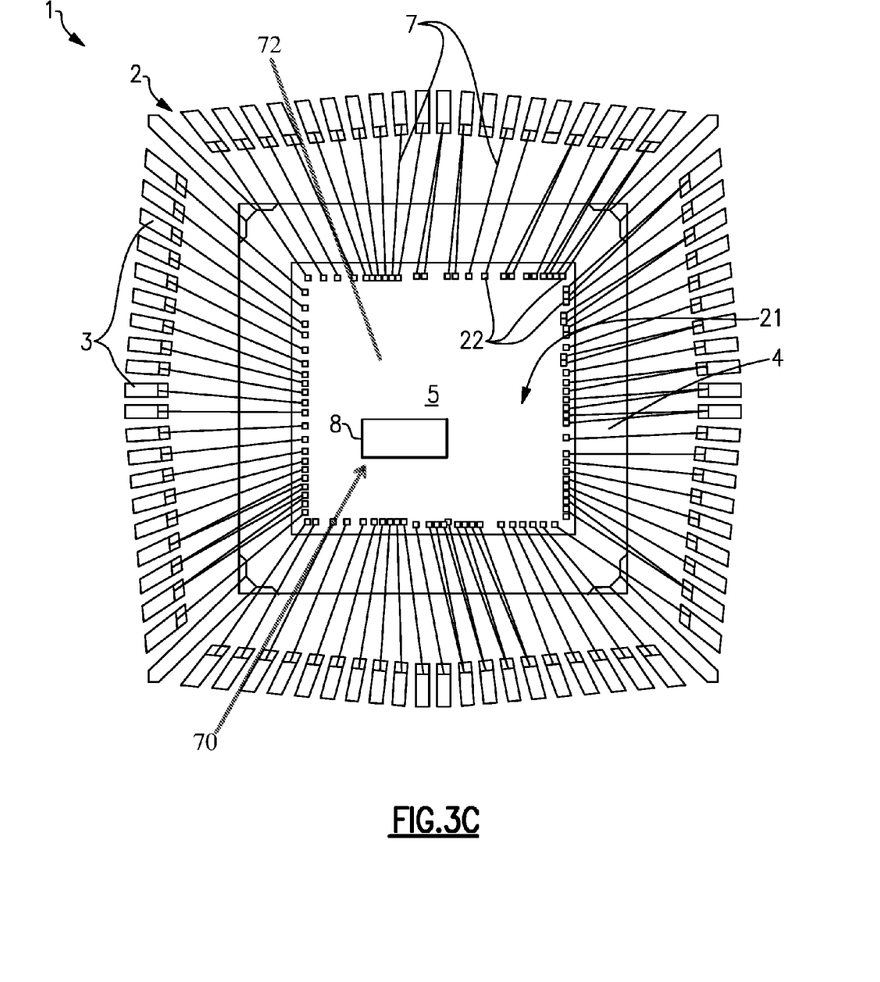
FIG. 3C is a top plan view of the integrated circuit package of FIG. 3A.

FIG. 3C is a top plan view of the integrated circuit package 1 of FIG. 3A. The molding material 10 shown in FIGS. 3A-3B has been omitted from FIG. 3C for ease of illustration. As shown in FIG. 3C, the leads 3 of the package substrate 2 (e.g., a leadframe substrate) can surround and can be electrically separated from the die attach pad 4. The bond pads 22 can be formed around the perimeter of the die attach pad 4. As illustrated in FIG. 3C, the shield plate 8 can be adhered to the IC die 5 to cover less than all the top surface 21 of the IC die 5. In particular, the shield plate 8 can leave the bond pads 22 exposed to enable wire bonding of the bonding wires 7 to the bond pads 22. In some embodiments, the shield plate can cover about 10% to about 90% of the top surface of the IC die, or more particularly about 10% to about 20% of the top surface of the IC die 5. Accordingly, in some embodiments, the shield plate 8 is attached to the IC die 5 over only the sensitive portions of the die 5, e.g., to cover only sensitive electronic circuitry 70 (the sensitive circuit 12 or sensitive portions of the circuit 12) and thus leave non-sensitive electronic circuitry 72 uncovered. In other embodiments, the shield plate 8 may cover most of the top surface of the IC die 5, e.g., substantially the entire top surface of the die 5 except for the bond pads 22.

It should be appreciated that, although only one shield plate 8 is illustrated in FIGS. 3A-3C, any suitable number of shield plates 8 may be attached to the IC die 5. For example, a shield plate 8 can be attached to the IC die 5 over each sensitive portion of the die 5. Thus, in some arrangements, multiple shield plates 8 (e.g., 2, 3, 4, 5, 10, 20 plates, etc.) may be attached to cover discrete sensitive portions or circuits of the die 5. Furthermore, because the illustrated shield plates 8 can be selectively adhered to the IC die 5 over less than all the top surface 21 of the IC die 5, the package assembler can save money and materials relative to alternatives in which the most of or the entire top surface 21 is covered by the shield plate or by a layer of deposited material.

Figure 4:
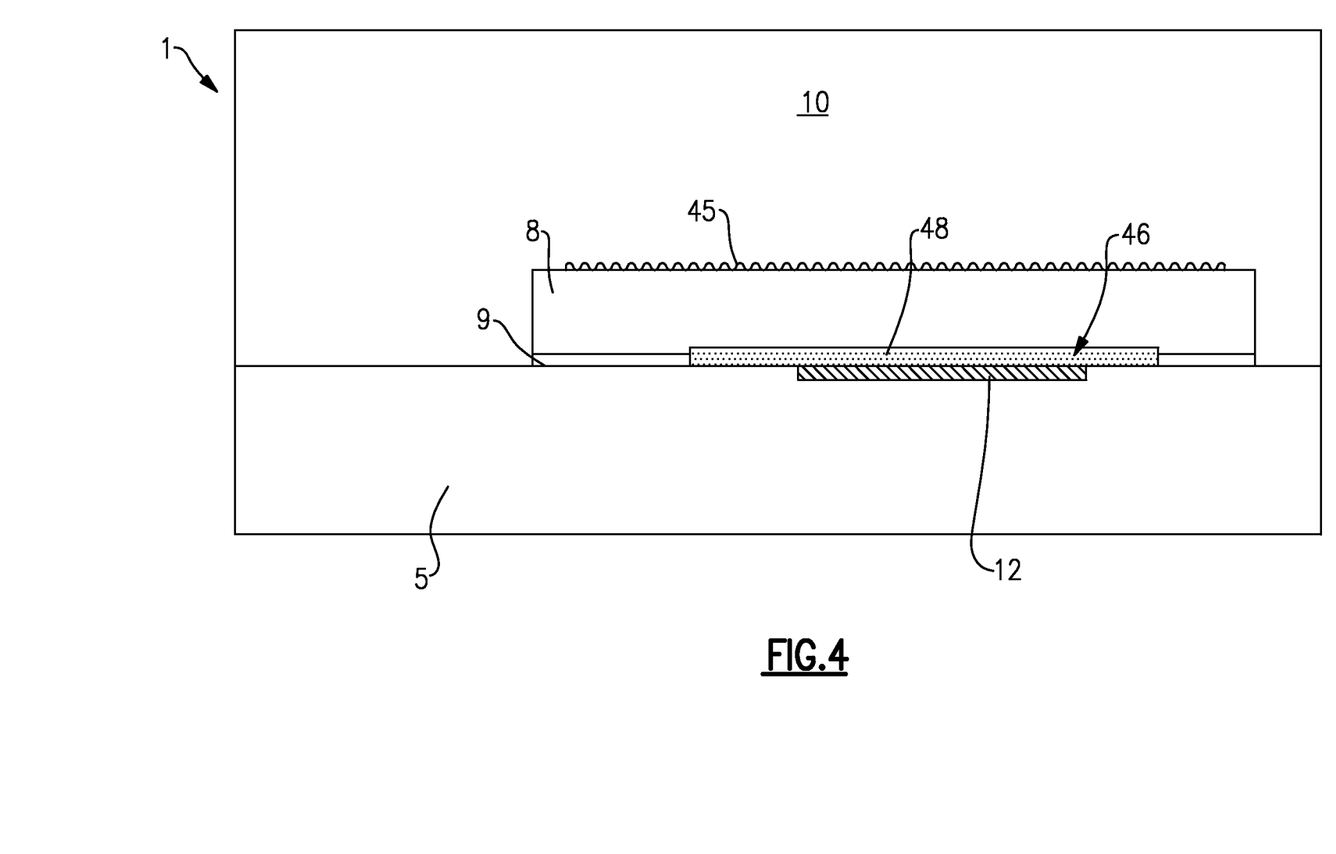
FIG. 4 is a magnified side cross-sectional view of an integrated circuit package according to another embodiment.

FIG. 4 is a magnified side cross-sectional view of an integrated circuit package 1 according to another embodiment. Unless otherwise noted, reference numerals used in FIG. 4 refer to the same or similar components as the reference numerals used in FIGS. 1-3C. For example, the package 1 can include an IC die 5 mounted to a package substrate (not illustrated in FIG. 4). A shield plate 8 can be adhered to the IC die 5 using an adhesive 9. The shield plate 8 can cover at least a sensitive circuit 12 of the die 5. A molding material 10 can be applied over the shield plate 8 and the IC die 5. In addition, as explained above, it can be advantageous to roughen a top side or surface of the shield plate 8 to enhance adhesion between the molding material 10 and the shield plate 8. Accordingly, as shown in FIG. 4, surface roughening features 45 may be formed in the top side of the shield plate 8 to prevent the molding material 10 from delaminating from the shield plate 8. The surface roughening features 45 may also be used in the package 1 shown in FIGS. 3A-3C.

However, unlike the embodiment illustrated in FIGS. 3A-3C, the shield plate 8 of FIG. 4 includes a cavity 46 formed or defined in a bottom side of the shield plate 8. The illustrated cavity 46 covers the sensitive circuit 12 and can be filled with a cavity filler 48. The cavity filler 48 can act to further shield and/or buffer the sensitive circuit 12 from stresses imparted by the molding compound 10. The cavity filler 48 may be air in some arrangements. However, in other arrangements, the cavity filler 48 may be a relatively elastic material such as a polymer, e.g., an epoxy. The shield plate 8 and cavity 46 may be applied over a substantially planar top surface of the IC die 5. Accordingly, in some embodiments, the shield plate 8 may include a cavity 46 filled with a cavity filler 48. In other embodiments, however, such as the embodiment of FIGS. 3A-3C, the shield plate 8 may not include a cavity.

As explained above, changing moisture content in the molding material can induce stresses that are substantially vertical, e.g., including stress components directed downwardly towards the top surface of the IC die. In some arrangements, the molding material can also induce horizontal stresses in the IC die, e.g., stresses that include components that are parallel to the top surface of the die. For example, varied vertical stresses across the die can induce stresses with a horizontal component. Additionally, the molding material may have a coefficient of thermal expansion that is different from a coefficient of thermal expansion of the IC die. Temperature changes may induce compressive stresses in the IC die in the x- and y-directions that are parallel to the top surface of the IC die.

To shield the IC die or sensitive portions of the IC die from horizontal stresses in the x- and y-directions, one or more trenches can be defined at least around sensitive portions of the IC die. For example, the trenches may define gaps between the sensitive portions of the die and the remainder of the die. The gaps can prevent stress, and the strain induced by the stress, from affecting the sensitive portions of the die. Further, to shield the sensitive portions of the IC die from vertical stresses in the z-direction, a shield plate can be adhered at least above the sensitive portions, as explained above. Thus, a shield plate can advantageously be used in combination with the one or more trenches to shield the die from stresses imparted in all directions.

Figure 5A:
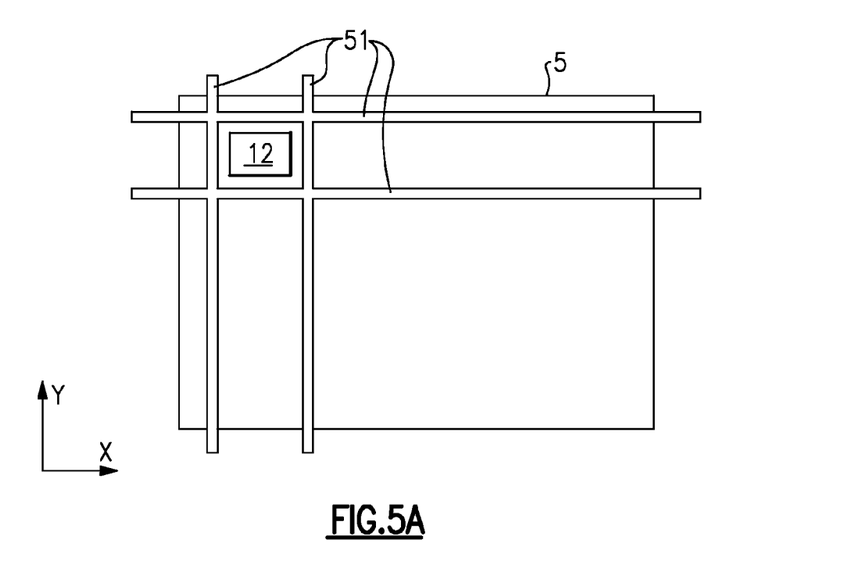
FIG. 5A is a top plan view of an integrated circuit die and saw lines for cutting partially through the die, according to one embodiment.

One way to form the trenches around the sensitive portions in the IC die is to partially saw through the thickness of the IC die. FIG. 5A is a top plan view of an integrated circuit die 5 and saw lines 51 for cutting partially through the die 5, according to one embodiment. The die 5 shown in FIG. 5A is illustrated before applying a shield plate, before dicing the wafer into a plurality of integrated circuit dies, and before applying the molding material. As shown in FIG. 5A, the saw lines 51 can be arranged around a sensitive portion 12 or circuit element of the die 5. One or more saws, or other cutting instruments, can be used to cut along the saw lines 51 through part of the thickness of the die 5.

Figure 5B:
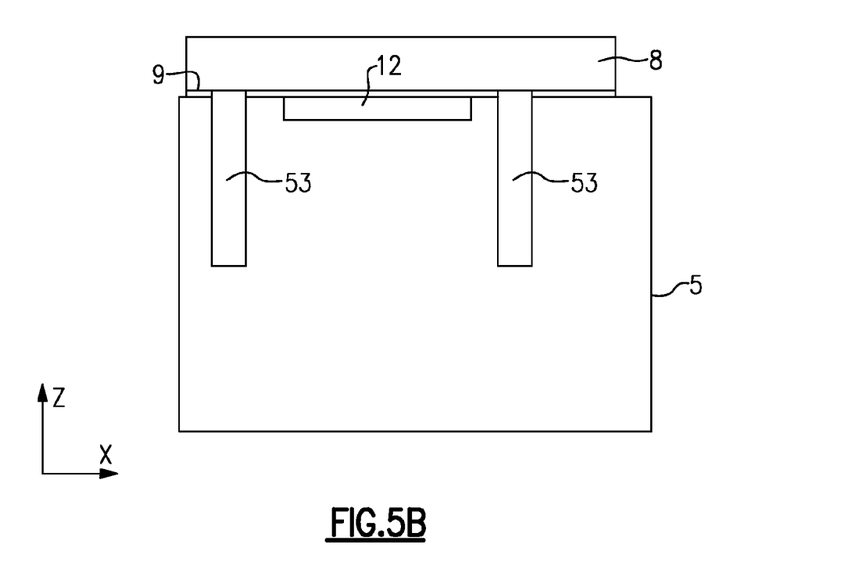
FIG. 5B is a magnified, side cross-sectional view of the integrated circuit die of FIG. 5A after partially sawing along the saw lines shown in FIG. 5A and adhering a shield plate.

FIG. 5B is a magnified, side cross-sectional view of the integrated circuit die 5 of FIG. 5A after partially sawing along the saw lines 51 shown in FIG. 5A and adhering a shield plate 8. As shown in FIG. 5B, the partial cuts can be used to form one or more trenches 53 at least around the sensitive portion 12 of the die 5. The trenches 53 can act to isolate or shield the sensitive portion 12 from horizontal stresses in the die 5, e.g., stresses having components parallel to the x- and y-directions shown in FIGS. 5A and 5B. In some embodiments, the trenches 53 can be formed at a depth of between about 600 microns and about 700 microns, for example, about 660 microns. Thus, stresses induced in the x- and y-directions in the die 5 may generate strain fields in the die 5, but the trenches 53 can block the strain fields from propagating across the trenches 53 and into the sensitive portion 12. The trench(es) 53 can thereby act to shield the die from horizontal stresses and strains.

In the embodiments of FIGS. 5A and 5B, cuts along the saw lines 51 may electrically isolate the sensitive portion 12 from the rest of the die 5 such that there are no die-level interconnects to route signals between the sensitive portion 12 and the remainder of the die 5. In some embodiments, bonding wires can be used to electrically connect the sensitive portion 12 inside the trenches 53 and the remainder of the die 5 outside the trenches 53. For example, in such embodiments, the shield plate may not cover the trenches, and the bonding wires can couple to the sensitive portion 12 and span the trenches 53 to the remainder of the die 5. In some embodiments, the sensitive portion can be electrically connected to other circuits below the level of the trenches 53, e.g., by through-silicon vias (TSVs). In other embodiments, the trenches 53 can be sawed outside bond pads, thereby isolating the entire die 5. During molding, the molding material may fill the trenches 53. In some arrangements, it may not be desirable to having molding material in the trenches 53. In such arrangements, a gel can be applied to coat the openings of the trenches 53 to prevent ingress of molding material into the trenches 53. Furthermore, it should be appreciated that the trenches 53 may be formed in a bottom surface of the die 5 in some embodiments. In such embodiments, the sensitive portion 12 may remain in electrical communication with the remainder of the die 5.

As shown in FIG. 5B, a shield plate 8 can be adhered to the die 5 using an adhesive 9. As explained above, the shield plate 8 can shield the die 5 from vertical stresses induced by the molding material (not shown) that is applied after the shield plate 8, e.g., stresses induced vertically downward in the z-direction towards the die 5. The shield plate 8 can cover the sensitive portion 12 of the die 5 and can overlie the trenches 53, as shown, preventing the molding material from filling the trenches 53 and more effectively isolating the sensitive portion 12 from lateral (x- or y-) stresses. In other arrangements, however, the shield plate 8 may only cover the sensitive portion 12, and the trenches 53 may lie outside the shield plate 8.

Figure 5C:
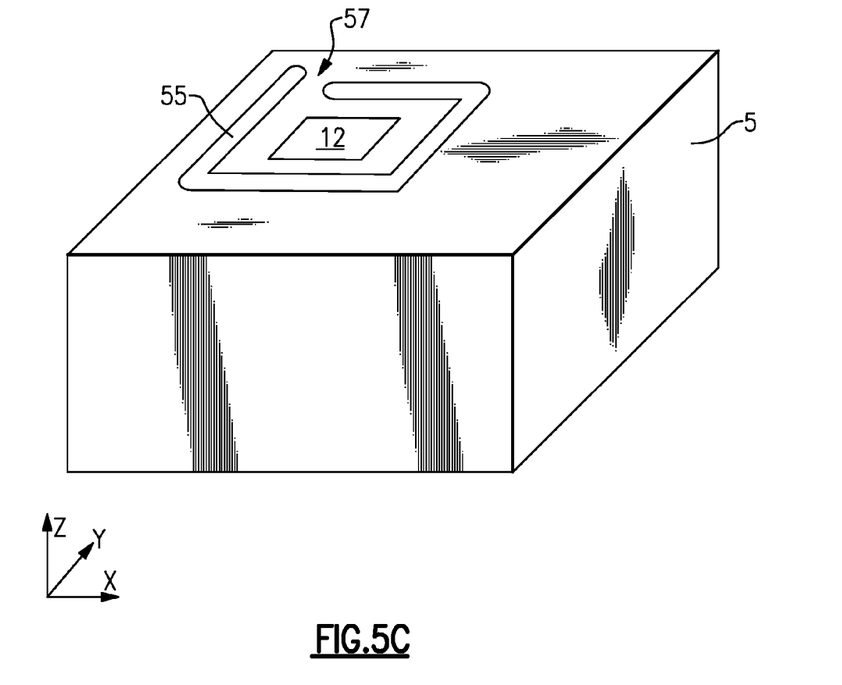
FIG. 5C is a three-dimensional perspective view of an integrated circuit die having laser-cut trenches formed therein partially around a sensitive portion of the die, according to another embodiment.

FIG. 5C is a three-dimensional perspective view of an integrated circuit die 5 having laser-cut trenches 55 formed therein around a sensitive portion 12 of the die 5. For ease of illustration, the shield plate and molding material are not shown. As explained above with respect to FIGS. 5A-5B, sawing trenches 53 in the die 5 may electrically isolate the sensitive portion 12 from the rest of the die 5. To prevent electrical isolation of the sensitive portion 12, a laser can be used to define the trenches 55 in any desirable pattern and to any suitable thickness. For example, as shown in FIG. 5C, the laser can cut trenches 55 at least partially through the thickness of the die 5 and can form an incomplete or open loop trench structure that provides an interconnecting region 57 to enable electrical routing between the sensitive portion 12 and the remainder of the die 5. Furthermore, in some arrangements, the laser cutting can be performed after attaching the die 5 to an underlying package substrate (e.g., leadframe). In such arrangements, the laser sawing may cut through the full thickness of the die 5 to improve stress isolation. As above, a shield plate (not shown) can be applied over the sensitive portion 12 to shield the sensitive portion 12 from stresses induced at least in the z-direction, and may also cover the trenches 55. In some embodiments, the trenches 53, 55 disclosed herein may be filled with a trench filler (e.g., a low-modulus polymer), while in other embodiments, the trenches may be filled with air or may be vacuum sealed. In some embodiments, the trenches 55 can be formed at a depth of between about 600 microns and about 700 microns, for example, about 660 microns.

Figure 5D:
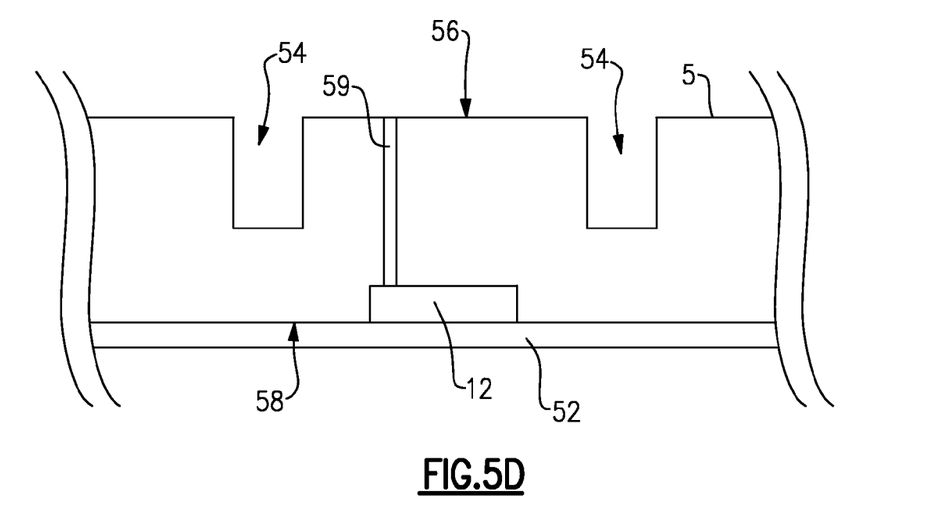
FIG. 5D is a schematic side cross-sectional view of an integrated circuit die mounted to a package substrate, in accordance with yet another embodiment.

FIG. 5D is a schematic side cross-sectional view of an integrated circuit (IC) die 5 mounted to a package substrate 52, in accordance with yet another embodiment. The IC die 5 can have a top surface 58 and a bottom surface 56 opposite the top surface 58. A sensitive portion 12 of the IC die 5 can be formed near the top surface 58 of the die 5. The package substrate 52 shown in FIG. 5D comprises a die paddle of a leadframe, but skilled artisans would understand that any suitable substrate may be used. In the embodiment of FIG. 5D, trenches 54 are formed at least partially through the thickness of the die 5 and are formed through the bottom surface 56 of the die 5. The trenches 54 can at least partially surround the sensitive portion 12 of the die 5 (e.g., can extend horizontally around the sensitive portion 12) and can protect the sensitive portion 12 from horizontal components of stresses, e.g., components parallel to the top surface 58 of the die 5. As shown in FIG. 5D, the die 5 can be flipped over and mounted to the substrate 52, such as by way of an adhesive (not show), such that the top surface 58 of the IC die 5 faces the substrate 52. As with the embodiments disclosed above, a molding material (not shown in FIG. 5D) may in some implementations be applied over the die 5. In the embodiment of FIG. 5D, the sensitive portion 12 of the die 5 can be protected from stresses caused by the molding material by the substrate 52. For example, the substrate 52 can serve as means to protect the sensitive portion 12 from stresses having a vertical component, e.g., a component of stress inwards towards the top surface 58 of the die 5. In some embodiments, a through-silicon via (TSV) 59 can be formed through the die 5 to provide electrical communication between the top surface 58 and the bottom surface 56 of the die 5.

Figure 6:
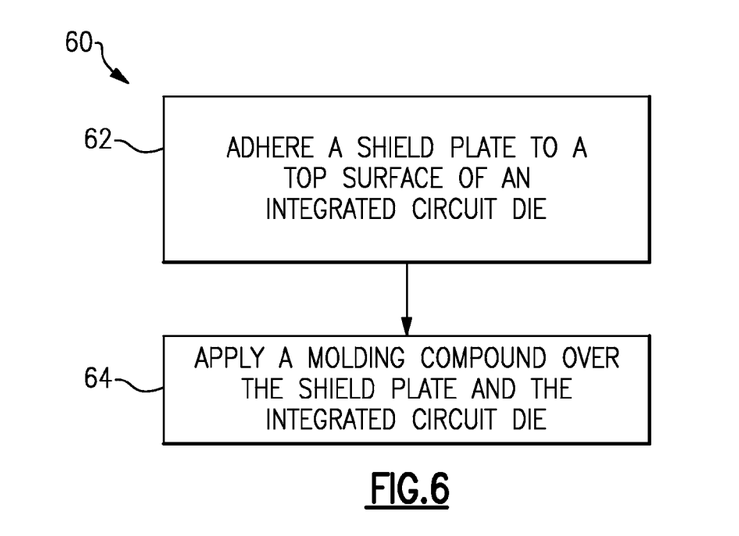
FIG. 6 is a flowchart illustrating a method of packaging an integrated circuit, according to one embodiment.

FIG. 6 is a flowchart illustrating a method 60 of packaging an integrated circuit, according to one embodiment. The method 60 begins in a block 62, in which a shield plate is adhered to a top surface (e.g., top passivation layer on a front side of the die) of an integrated circuit die. In some arrangements, the shield plate covers less than all of the top surface and leaves bond pads exposed. For example, in some embodiments, an adhesive can be applied to the shield plate or to the top surface of the IC die, and the shield plate can be attached directly to the top surface of the IC die. As explained above with respect to FIGS. 3A-3C and 4, the shield plate can be adhered over a stress-sensitive circuit (or portion thereof). In some embodiments, the sensitive circuit can be configured to output an absolute reference voltage. For example, in particular embodiments, the sensitive circuit is a bandgap reference circuit.

In some embodiments, the shield plate can be a silicon cap; in other embodiments, the shield plate can comprise glass; in still other embodiments the shield plate can be metal. The shield plate can have a thickness in a range of about 100 microns to about 300 microns, and more particularly, in a range of about 150 microns to about 250 microns. The adhesive can have a thickness in a range of about 20 microns to about 30 microns in various arrangements. The shield plate may or may not have a cavity formed in a bottom side of the plate; if a cavity is present, the method can include filling the cavity with a cavity filler, as described with respect to FIG. 4.

The method 60 moves to a block 64, in which a molding material is applied over the shield plate and the IC die. As explained above, the molding material can include a plastic material and can be dispersed with filler particles, such as silica, to improve thermal matching to the IC die relative to the plastic encapsulant or molding material alone. When moisture is absorbed in the molding material, spatially varying forces can be imparted to the IC die and can negatively affect the performance of the sensitive circuit. The shield plate disposed between the molding material and the IC die can shield the sensitive circuit from the stresses caused by the molding material by absorbing or blocking the stresses.

As explained above, the IC die can be mounted to a package substrate, such as a leadframe, liquid crystal polymer (LCP) molded leadframe, PCB, ceramic packaging substrate, etc. In embodiments utilizing a leadframe substrate, the leadframe can include an array of leadframe device cells such that each leadframe device cell includes a die attach pad and a plurality of leads surrounding the die attach pad. Thus, skilled artisans would appreciate that each leadframe device cell can be configured to support an IC device die. Multiple IC dies can be mounted one each to an associated die attach pad on the leadframe, and bond pads of the IC dies can be wire bonded to corresponding leads. In some embodiments, shield plates can be adhered to top surfaces of the plurality of corresponding IC dies such that the shield plate of each cell covers less than all of the top surfaces of the IC dies and leaves the bond pads exposed. For example, each shield plate can cover about 10% to about 90% of the top surface of the IC die, or more particularly about 10% to about 20% of the top surface of the IC die. The molding material can be applied over the shield plates and the IC dies. The leadframe can be singulated into a plurality of singulated packages.

Accordingly, in some embodiments, the shield plates are attached to the IC dies during assembly of the package. For example, in such assembly-level processes, the shield plates are attached to the IC dies after the individual IC dies have been mounted to the package substrate but before singulation. Thus, in some manufacturing techniques, individual IC dies are mounted on a leadframe array, and then shield plates are adhered to the IC dies. After adhering the shield plates to the IC dies, the molding material can be applied over the IC dies and the shield plates. Subsequently, the leadframe can be singulated to yield individual, singulated packages.

In other embodiments, the shield plates can be attached at the wafer level before the individual IC dies are diced or separated from the wafer. In some wafer-level processes, for example, a wafer can include multiple IC dies, and individual shield plates can be adhered to respective IC dies on the wafer. In other embodiments, the shield plates can be formed from one wafer and the IC dies can be defined on another wafer. The two wafers can be bonded together and diced (e.g., sawed apart) to form individual, bonded IC dies and associated shield plates. Upon dicing the bonded wafers, multiple, separate IC dies can be created, with each IC die including one or more adhered shield plates. Each IC die and its associated shield plate(s) can then be mounted as a unit to a respective leadframe device cell of a leadframe (or to another type of substrate). The molding material can be applied over the IC dies and shield plates, and the leadframe (or other type of substrate) can be singulated into a plurality of separate IC packages.

In further embodiments, one or more trenches may be formed at least partially through the thickness of the die around sensitive portions of the die. As explained above with respect to FIGS. 5A-5D, the trench(es) can shield the sensitive portions from stresses having horizontal components. The trenches can be formed by sawing through a portion of the thickness of the die using a saw. In other embodiments, the trenches can be formed by using a laser to cut partway through the thickness of the die. The trenches can be formed in the front side of the die (FIGS. 5A-5C) or the backside of the die (FIG. 5D).

It should be appreciated that the method 60 of FIG. 6 and the techniques discussed herein describe only a few example methods and are not meant to limit the order in which various steps are performed. Indeed, skilled artisans will appreciate that the order of the steps discussed herein can be performed in any suitable order.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated circuit package, comprising:
   a package substrate;
   an integrated circuit die mounted to the package substrate, the integrated circuit die comprising a bottom surface coupled to the package substrate and a top surface opposite the bottom surface, the integrated circuit die comprising sensitive electronic circuitry formed in one or more layers of the integrated circuit die and one or more bond pads;
   a molding material applied over the integrated circuit die; and
   a shield plate attached by an adhesive to the top surface of the integrated circuit die between the molding material and the integrated circuit die, the shield plate including a cavity formed in a bottom side of the shield plate facing the integrated circuit die, the cavity being defined by a recessed surface in the shield plate that is recessed relative to the bottom side of the shield plate, the shield plate covering the sensitive electronic circuitry and leaving non-sensitive electronic circuitry of the integrated circuit die uncovered.

2. The integrated circuit package of claim 1, wherein the shield plate leaves the bond pads exposed.

3. The integrated circuit package of claim 1, wherein the shield plate comprises a silicon cap.

4. The integrated circuit package of claim 1, wherein the shield plate comprises glass.

5. The integrated circuit package of claim 1, wherein the sensitive electronic circuitry comprises a sensitive circuit, and wherein the shield plate is disposed over the sensitive circuit to shield the sensitive circuit from stresses from the molding material.

6. The integrated circuit package of claim 5, wherein the sensitive circuit is configured to output an absolute reference voltage.

7. The integrated circuit package of claim 6, wherein the sensitive circuit comprises a bandgap reference circuit.

8. The integrated circuit package of claim 5, further comprising one or more trenches formed in the integrated circuit die around the sensitive circuit.

9. The integrated circuit package of claim 1, wherein the shield plate has a thickness in a range of about 150 microns to about 250 microns.

10. The integrated circuit package of claim 1, further comprising the adhesive, wherein the adhesive has a thickness in a range of about 20 microns to about 30 microns.

11. The integrated circuit package of claim 1, wherein the molding material comprises about 80-90% silica particles.

12. The integrated circuit package of claim 1, wherein the shield plate has a Young's modulus higher than a Young's modulus of the molding material.

13. The integrated circuit package of claim 1, further comprising a cavity filler disposed in the cavity.

14. The integrated circuit package of claim 1, wherein the shield plate and the cavity cover a substantially planar top surface of the integrated circuit die.

15. An integrated circuit package, comprising:
    a package substrate;
    an integrated circuit die mounted to the package substrate, the integrated circuit die having a top surface and a bottom surface, the integrated circuit die comprising sensitive electronic circuitry formed in one or more layers of the integrated circuit die, one or more bond pads, and one or more trenches at least partially surrounding a stress-sensitive circuit;
    a molding material applied over the integrated circuit die; and
    means for shielding the stress-sensitive circuit from stresses induced by the molding material, the stresses including a component perpendicular to the top surface of the integrated circuit die, the shielding means covering the sensitive electronic circuitry and leaving non-sensitive electronic circuitry of the integrated circuit die uncovered,
    wherein the shielding means comprises a substantially planar plate such that the integrated circuit package does not include a cavity between the shielding means and an upper surface of the integrated circuit die.

16. The integrated circuit package of claim 15, wherein the one or more trenches are formed through the bottom surface of the integrated circuit die.

17. The integrated circuit package of claim 15, wherein the shielding means comprises a shield plate adhered to the integrated circuit die over the stress-sensitive circuit.

18. The integrated circuit package of claim 1, wherein the shield plate covers about 10% to about 90% of the top surface of the integrated circuit die.

19. The integrated circuit package of claim 18, wherein the shield plate covers about 10% to about 20% of the top surface of the integrated circuit die.

20. The integrated circuit package of claim 15, wherein the shielding means covers about 10% to about 90% of the top surface of the integrated circuit die.

21. The integrated circuit package of claim 1, further comprising a plurality of shield plates attached to the top surface of the integrated circuit die between the molding material and the integrated circuit die.

22. The integrated circuit package of claim 17, further comprising a plurality of shield plates adhered to the integrated circuit die.

23. The integrated circuit package of claim 1, wherein the covered portion of the sensitive electronic circuitry includes ratioed transistors.

24. An integrated circuit package, comprising:
    a package substrate;
    an integrated circuit die mounted to the package substrate, the integrated circuit die having a top surface and a bottom surface, the integrated circuit die comprising sensitive electronic circuitry formed in one or more layers of the integrated circuit die and one or more bond pads;

a molding material applied over the integrated circuit die; and a shield plate attached by an adhesive to the top surface of the integrated circuit die between the molding material and the integrated circuit die, the shield plate shielding the sensitive electronic circuitry from stresses induced by the molding material, the stresses including a component perpendicular to the top surface of the integrated circuit die, the shield plate covering the sensitive electronic circuitry and leaving non-sensitive electronic circuitry of the integrated circuit die uncovered, wherein the shield plate comprises a substantially planar plate such that the integrated circuit package does not include a cavity between the shield plate and the top surface of the integrated circuit die.

25. The integrated circuit package of claim 24, wherein the shield plate leaves the one or more bond pads exposed.

26. The integrated circuit package of claim 24, wherein the shield plate covers about 10% to about 90% of the top surface of the integrated circuit die.

27. The integrated circuit package of claim 26, wherein the shielding means covers about 10% to about 20% of the top surface of the integrated circuit die.

28. The integrated circuit package of claim 24, further comprising a plurality of shield plates attached to the top surface of the integrated circuit die between the molding material and the integrated circuit die.

29. The integrated circuit package of claim 24, wherein the sensitive electronic circuitry comprises a sensitive electronic circuit that is configured to output an absolute reference voltage.

30. The integrated circuit package of claim 29, wherein the sensitive circuit comprises a bandgap reference circuit.

31. The integrated circuit package of claim 24, wherein the shield plate has a thickness in a range of about 150 microns to about 250 microns.

32. The integrated circuit package of claim 24, wherein the shield plate comprises a silicon cap.

\* \* \* \* \*